United States Patent [19]

Huebner

[11] 4,217,017

[45] Aug. 12, 1980

[54] ANGLE ADAPTER FOR AN ELECTRICAL COMPONENT

[75] Inventor: Wolfgang Huebner, Munich, Fed. Rep. of Germany

[73] Assignee: Siemens Aktiengesellschaft, Berlin & Munich, Fed. Rep. of Germany

[21] Appl. No.: 930,500

[22] Filed: Aug. 3, 1978

[30] Foreign Application Priority Data

Aug. 30, 1977 [DE] Fed. Rep. of Germany ....... 7726886

[51] Int. Cl.[2] ................................................ H05K 1/18

[52] U.S. Cl. .......................... 339/17 F; 339/176 MF

[58] Field of Search ...................... 339/17 F, 176 MF; 174/117 R

[56] References Cited

U.S. PATENT DOCUMENTS 2,951,112 8/1960 Dahlgren ...................... 339/17 F X 3,027,417 3/1962 Turner .......................... 339/17 F X 3,353,069 11/1967 Slavin ........................... 339/17 F X

*Primary Examiner*—Roy Lake

*Assistant Examiner*—Eugene F. Desmond

*Attorney, Agent, or Firm*—Hill, Van Santen, Steadman, Chiara & Simpson

[57] ABSTRACT

An angle adapter for an electrical component, particularly for a relay, is disclosed. It consists of a base member comprising a carrier plate for the component as well as a terminal or connection strip for accommodating contact pins. Both parts consist of synthetic material and at least the connection trip is constructed in the form of a flexible conductor path whereby connecting elements between the terminals of the components and the contact pins of the adapter are constructed in the form of conductor paths.

15 Claims, 5 Drawing Figures

ANGLE ADAPTER FOR AN ELECTRICAL COMPONENT

BACKGROUND OF THE INVENTION

1. Field of the Invention:

The invention relates to an angle adapter for an electrical component, particularly a relay, comprising a number of conductor elements corresponding to the number of contact pins of the component, and further comprising an equal number of adapter contact pins capable of being anchored in a base member.

2. Prior Art:

Electrical components, for example, relays, frequently have a box-shaped housing with varying side lengths. Depending upon the construction, in the case of normal installation of such a component on a printed-circuit board, there results a large basic surface area with minimal height or large height with minimal basic surface area. In order to meet the different demands regarding structural height and basic surface area, the installation position of such components is changed with the aid of angle adapters or angle plug-socket holders. However, adapters of this type have been, up to the present time, relatively expensive to manufacture and also to assemble because generally the contact pins of the component must each be individually connected to a connecting element through welding or the like, in order to establish the electrical coupling to the contact pins of the adapter.

SUMMARY OF THE INVENTION

It is an object of the invention to produce an angle adapter for an electrical component which is simple and inexpensive to manufacture, and wherein the necessary electrical connections can be commonly established in one operation and in as mechanized a fashion as possible.

In accordance with the invention, this object is achieved by virtue of the fact that the base member consisting of insulating material forms a carrier plate for the component as well as a terminal or connection strip for accommodating the adapter contact pins, and that the connection elements are constructed in the form of conductor paths of a flexible printed-circuit board which manifests at its ends perforations for the adapter contact pins and for the contact pins of the component, respectively.

The inventive angle adapter thus consists of a base member and a flexible printed-circuit board. Simple manufacture and assembly is provided as a consequence since the connections of the contact pins to the printed-circuit board can be manufactured largely in an automated fashion, for example, in a solder bath. In order to be able to adapt a large number of component terminals it is expedient to utilize a double-clad printed-circuit board. The conductor paths for electrical connection then run partially on the one, and partially on the other side of the printed-circuit board.

The adapter contact pins can be rigidly anchored in a base member, for example, by means of injection. However, it is also possible to first connect them to the flexible printed-circuit board and then plug them into openings of the base member. The terminal or connection strip for accommodating the adapter contact pins can be provided in the region of the carrier plate. Thus, in this case, the contact pins are disposed directly beneath the component, such that the basic surface area of the component is not enlarged by the adapter.

In another embodiment, the terminal strip is arranged as an extension of the carrier plate and connected to the latter, e.g., by means of film band serving as a hinge which is shaped, molded, or formed thereon. In a further extension of the terminal strip, the base member can have additional cover strips which can be folded over the terminal strip and which serve as a protection against human contact by covering the adapter terminal space. The last cover strip can be connected to a locking or retaining member constructed on the carrier plate. For the purpose of mounting, in a preferred embodiment it is provided that the cover element has a perforation or opening with which can be plugged onto a pin of the locking member according to the snap-fastening principle.

Additional locking elements, for example, in the form of lateral tongues, can be provided on the carrier plate of the adapter and which provide the plugged-on component with additional support. These lateral tongues are provided with detent teeth which engage or snap-in at the upper edge or in lateral recesses of the component protective cap or hood.

DESCRIPTION OF THE PREFERRED EMBODIMENTS

Figure 1:
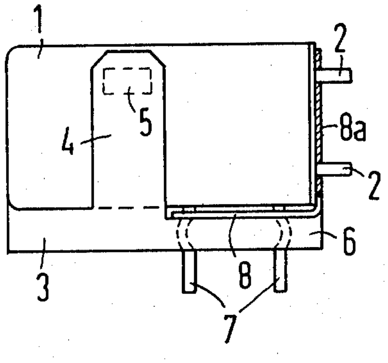
FIG. 1 illustrates an electrical component and angle adapter according to the invention in lateral view.

FIG. 1 illustrates an electrical component 1, e.g., a relay, comprising contact pins 2 emerging on the narrow side. This component is intended to be placed on a printed circuit board such that it lies in a flat level position. For this purpose, an adapter base member 3 is provided which serves as a carrier plate for component 1, and manifests lateral tongues 4 for the additional support-mounting of the component. On the interior sides, these tongues 4 each respectively possess detent projections 5 indicated in the drawing, which, for example, snap into recesses of the protective cap of component 1.

The adapter base member 3 possesses a terminal strip 6 which, in this instance, is disposed in the region of the seat engaging or supporting surface of component 1 such that the basic surface area is not enlarged by the adapter. Adapter-contact pins 7 are present in the terminal strip which are connected on the upper side of terminal strip 6 with one conductor path, respectively, of a flexible printed-circuit board 8. For this purpose, the adapter base member with the flexible printed-circuit board 8 plugged onto the contact pin 7, is carried through a solder bath before component 1 is placed thereon. Subsequent to the placement of component 1, the still-free section 8*a* of the flexible printed-circuit board is plugged onto the contact pins 2 of component 1, and in turn, connected with the latter by means of solder flow.

Figure 2:
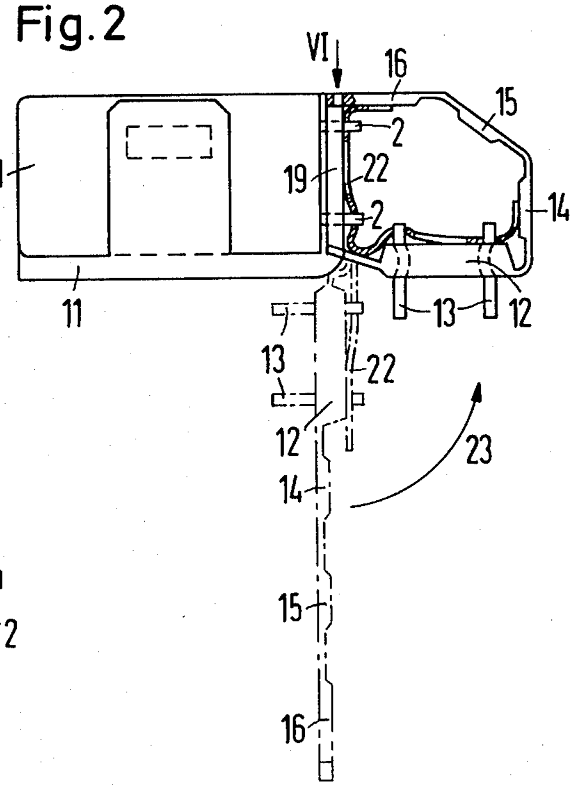
FIG. 2 illustrates an electrical component and angle adapter in another embodiment.
Figure 3:
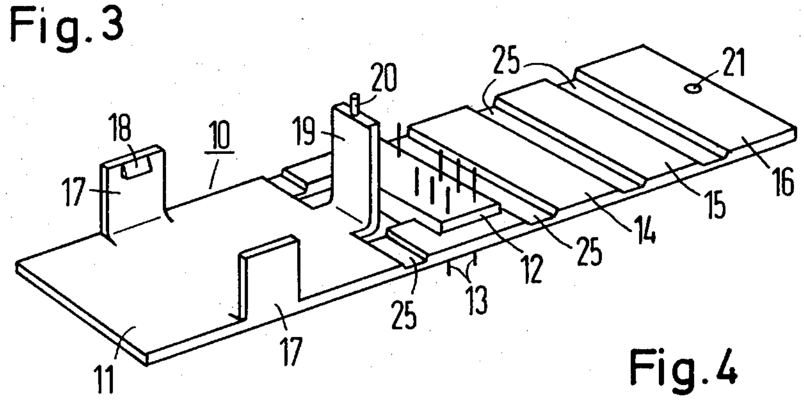
FIG. 3 illustrates the adapter base member of FIG. 2 in a perspective illustration.

Another embodiment is illustrated in FIGS. 2 and 3. The adapter base member 10 according to FIG. 3 is provided with the carrier plate 11, a terminal (or connection) strip 12, arranged in connection with the carrier plate, said terminal strip 12 comprising injected adapter contact pins 13 as well as three cover strips or bars 14, 15, and 16. All these parts of the base member are interconnected via film tape or band hinges or hinge joints 25, respectively; the entire base member 10 is thus injection-molded in one piece consisting of synthetic material such as plastic. The carrier plate 11 is provided with lateral tongues 17 which enclose or surround the component 1 and hold or retain the latter with projections or tongues which are capable of engagement. Moreover, a retaining or locking arm 19 is provided which, during assembly, is joined to the outermost cover strip 16 such that the angle adapter is closed from above. For this purpose, the holding arm 19 has a pin 20 onto which the cover strip 16 can be plugged by means of a perforation 21 according to the snap-fastener or push-on principle.

Figure 4:
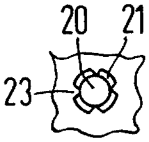
FIG. 4 illustrates in detail view IV in FIG. 2.

The assembly can be seen on the basis of FIG. 2. Component 1 is first placed on carrier plate 11 and the holding strip 12, with the cover strips 14, 15, and 16, is aligned in one plane with the terminal side of the component indicated on the drawing by the parts illustrated in broken lines. A flexible printed-circuit board 22 which is preferably double-clad, is then placed on the adapter base member in a flat fashion, and plugged onto the contact pins 2 of component 1 as well as onto the adapter contact pins 13. All connection locations are disposed in one plane such that the component terminals as well as the adapter terminals can be soldered together in one operation by means of the flow method. Then the adapter is folded over in the direction of arrow 23 such that the terminal strip 12 reaches the installation plane and the cover strips 14, 15, and 16, close off the terminal space from above. The cover strip 16 is plugged onto the holding arm 19. FIG. 4 illustrates, in a detail view, the connection location between pin 20 and perforation 21. This perforation has deformable ribs 23 with which the cover strip 16 can be mounted onto the pin 20 in a force-locking manner.

Figure 5:
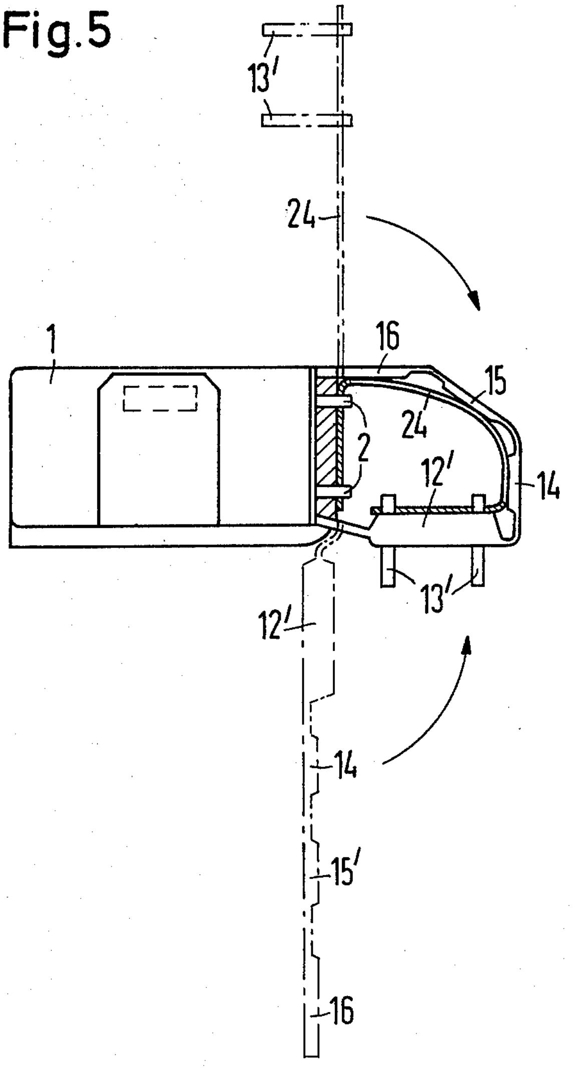
FIG. 5 illustrates a slightly altered embodiment of the adapter of FIG. 2.

FIG. 5 illustrates a slightly modified embodiment. The adapter base member is essentially constructed precisely as in FIG. 3. Only the adapter contact pins 13 are, in this instance, not injected into the terminal strip 12. On the contrary, the latter are first connected to a flexible printed-circuit board 24. During assembly, the adapter base member with its molded-on terminal and cover-strips 12, 14, 15, and 16, respectively, is unfolded in the one direction, whereas the flexible printed-circuit board 24 is arranged in the other direction. The adapter contact pins 13 initially mounted in the flexible printed-circuit board 24 in a provisional manner, for example, by means of an additional paper path, are flow-soldered in one plane together with the contact pins 2 of component 1. Then the flexible printed-circuit board 24 and the terminal and cover strips 12, 14, 15, and 16 of the adapter base member 10 are folded one over the other, whereby the adapter contact pins 13 are plugged into bores of the terminal or connection strip 12. There they can be secured, e.g., by means of twisting. The mounting of the cover strips proceeds precisely as in FIG. 2.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An angle adapter system for an electrical component, comprising:

an electrical component having a number of contact pins; an angle adapter comprising (a) a base member comprised of an insulating material;

(b) a given number of conductor elements at least corresponding to the number of contact pins of the component to be contacted;

(c) a number of adapter contact pins anchored to the base member at least equal to the given number;

(d) said base member having a planar carrier plate, said component being mounted on the carrier plate such that its contact pins are substantially parallel to the planar plate, and a terminal strip means for accommodating the adapter contact pins and for rigidly positioning them at substantially right angles to the component contact pins;

(e) said conductor elements comprising conductor paths on a flexible printed-circuit board connecting the adapter contact pins and the contact pins of the component; and (f) means for rigidly supporting the terminal strip means to allow manually plugging the adapter pins and attached electrical component into a circuit with the electrical component at substantially right angles to its normal plug-in position without an adapter.

2. An angle adapter system according to claim 1 wherein the printed-circuit board is double-clad.

3. An angle adapter system according to claim 1 wherein the adapter contact pins are rigidly anchored in the terminal strip of the base member.

4. An angle adapter system according to claim 1 wherein the adapter contact pins are in fixed connection only with the flexible conductor path and are receivable into apertures of the terminal strip of the base member.

5. An angle adapter system according to claim 1 wherein the terminal strip is provided in the region of the carrier plate.

6. An angle adapter system according to claim 1 in which the base member has a terminal strip arranged on an extension of the carrier plate and of integral construction with said carrier plate.

7. An angle adapter system according to claim 6 in which the terminal strip is connected with the carrier plate via a film band hinge means.

8. An angle adapter system according to claim 6 in which the said extension comprises a plurality of cover strips each respectively connected via film band hinge means for permitting folding of the extension over the terminal strip.

9. An angle adapter system according to claim 8 in which an outermost one of said cover strips has a mounting means for connection with a holding arm constructed on the carrier plate.

10. An angle adapter system according to claim 9 in which the mounting means comprises a perforation cooperating with a pin on the holding arm in snap-fastening manner.

11. An angle adapter system according to claim 1 in which the carrier plate is provided with support element means shaped on the carrier plate for mounting the component.

12. An angle adapter for an electrical component having a number of contact pins protruding from one end, comprising:
(a) a base member having a carrier plate means for the component, a hinged planar extension portion connected to the carrier plate means, and a terminal strip with adapter contact pins therein mounted on a major planar surface of the extension portion with the adapter contact pins at right angles to the major surface;
(b) a flexible printed-circuit board having contact path means for connecting each of the component contact pins to each of the adapter contact pins; and
(c) said carrier plate means receiving the component such that the contact pins protrude above and parallel to the carrier plate means,
and said extension major planar surface being parallel with the carrier plate means when the adapter is in a configuration ready for mounting.

13. An angle adapter for an electrical component having a number of contact pins, comprising:
(a) a base member comprised of an insulating material;
(b) a given number of conductor elements corresponding to the number of contact pins of the component;
(c) a number of adapter contact pins anchored in the base member equal to the given number;
(d) said base member having a carrier plate means for the component and a terminal strip means for accommodating the adapter contact pins;
(e) said conductor elements comprising conductor paths on a flexible printed-circuit board, aperture means being provided in ends of the conductor paths for receiving said adapter contact pins and the contact pins of the component;
(f) the base member having a terminal strip arranged on an extension of the carrier plate and of integral construction with said carrier plate;
(g) said extension comprising a plurality of cover strips each respectively connected via film band hinge means for permitting folding of the extension over the terminal strip; and
(h) an outermost one of said cover strips having a mounting means for connection with a holding arm constructed on the carrier plate.

14. An angle adapter according to claim 13 in which the mounting means comprises a perforation cooperating with a pin on the holding arm in snap-fastening manner.

15. An angle adapter for an electrical component having a number of contact pins protruding from one end, comprising:
(a) a base member having a carrier plate means for the component, a hinged planar extension portion connected to the carrier plate means, and adapter contact pins mounted through a major planar surface of the extension portion with the adapter contact pins at right angles to the major surface;
(b) a flexible printed-circuit board having contact path means for connecting each of the component contact pins to each of the adapter contact pins; and
(c) said carrier plate means receiving the component such that the contact pins protrude above and parallel to the carrier plate means,
and said extension major planar surface being parallel with the carrier plate means when the adapter is in a configuration ready for mounting.

* * * * *